United States Patent
Ravi (10) Patent No.: US 9,317,353 B2
(45) Date of Patent: Apr. 19, 2016

(54) METHOD, APPARATUS AND SYSTEM FOR PERFORMING VOLTAGE MARGINING

(71) Applicant: Intel Corporation, Santa Clara, CA (US)

(72) Inventor: Sanjay R. Ravi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 194 days.

(21) Appl. No.: 14/140,834

(22) Filed: Dec. 26, 2013

(65) Prior Publication Data

US 2015/0186197 A1    Jul. 2, 2015

(51) Int. Cl.
| | |
|---|---|
| *G06F 11/00* | (2006.01) |
| *G06F 11/07* | (2006.01) |
| *G01R 31/30* | (2006.01) |
| *H04L 25/49* | (2006.01) |

(52) U.S. Cl.
CPC .......... *G06F 11/076* (2013.01); *G01R 31/3004* (2013.01); *G06F 11/0745* (2013.01); *H04L 25/4923* (2013.01)

(58) Field of Classification Search
CPC .............. G06F 11/076; G06F 11/0745; H04L 25/4923
See application file for complete search history.

(56) References Cited

U.S. PATENT DOCUMENTS

| | | | |
|---|---|---|---|
| 8,549,205 B1 | 10/2013 | Harriman et al. | |
| 2006/0227912 A1* | 10/2006 | Leibowitz | G01R 31/31709 375/350 |
| 2013/0241622 A1* | 9/2013 | Zerbe | G11C 7/02 327/323 |

OTHER PUBLICATIONS

European Patent Office, Extended Search Report mailed Jun. 9, 2015, in European Patent Application No. 14196167.2.
Byungho, Min, et al., "A 20Gb/s Triple-mode (PAM-2, PAM-4, and duobinary) Transmitter", Circuits and Systems (MWSCAS), 2011 IEEE 54th International Midwest Symposium On, IEEE, Aug. 7, 2011, pp. 1-4, XP031941225, DOI 10.1109/MWSCAS.2011.6026281 ISBN: 978-1-61284-856-3.
Kwang-Hun, Lee, et al., "An Asymmetric 4-PAM Transceiver With 5.6-Gb/s/channel Data Rate for Display Interface With Ultra-High Definition", International Journal of Control and Automation, vol. 6, No. 6, Dec. 31, 2013, pp. 177-190, XP055192027, ISSN: 2005-4297, DOI: 10.14257/ijca.2013.6.6.17.

* cited by examiner

*Primary Examiner* — Sam Rizk
(74) *Attorney, Agent, or Firm* — Trop, Pruner & Hu, P.C.

(57) ABSTRACT

In one embodiment, a receiver is coupled to a transmitter via an interconnect. The receiver includes a voltage margining circuit to receive non-deterministic data transmitted by the transmitter via a multi-level signaling scheme and to generate a bit error report including bit error information obtained at a plurality of margining levels. Other embodiments are described and claimed.

29 Claims, 6 Drawing Sheets

METHOD, APPARATUS AND SYSTEM FOR PERFORMING VOLTAGE MARGINING

TECHNICAL FIELD

This disclosure pertains to computing systems, and in particular (but not exclusively) to providing voltage margining operations.

DETAILED DESCRIPTION

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

Figure 1:
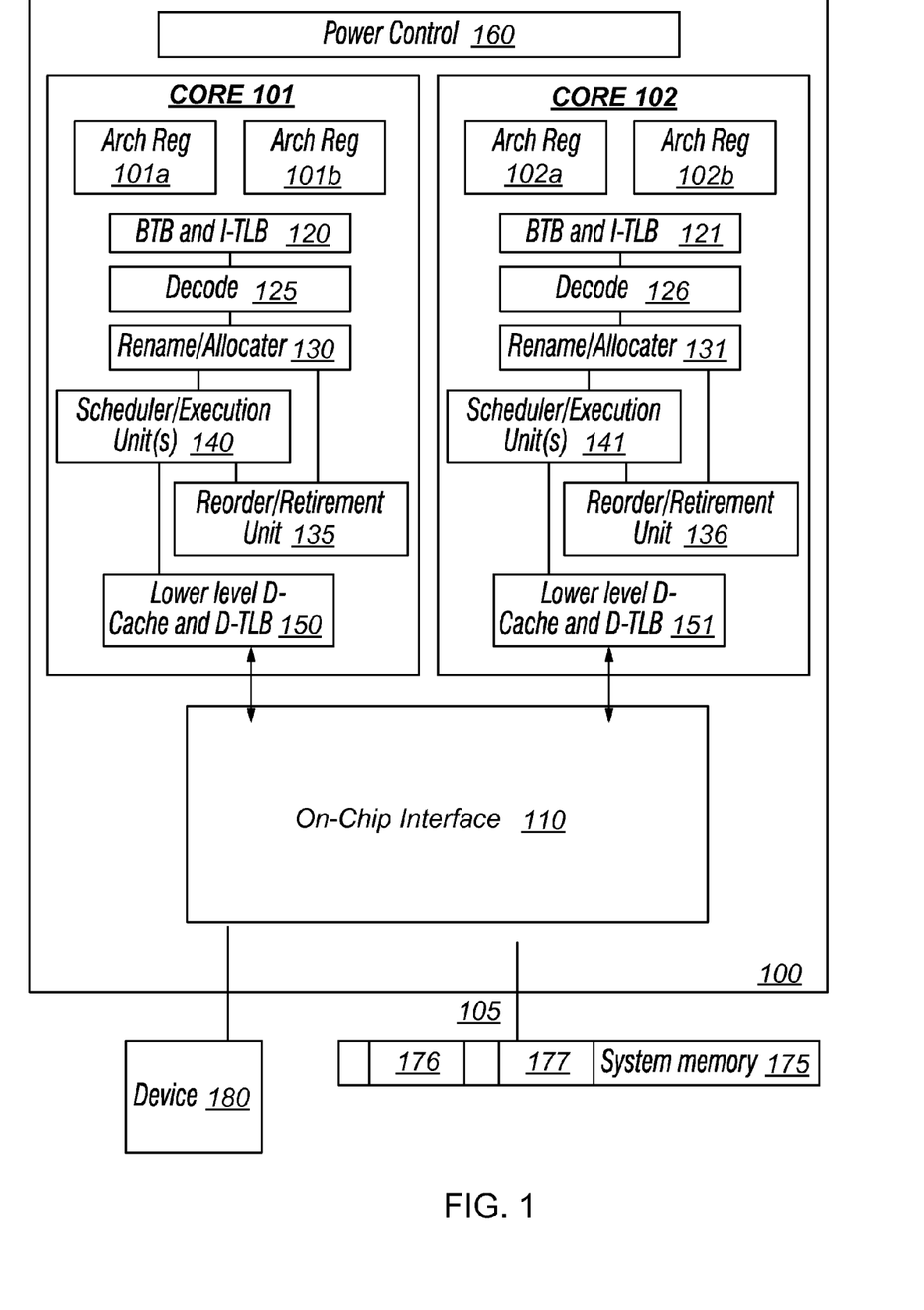
FIG. 1 illustrates an embodiment of a block diagram for a computing system including a multicore processor.

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 102a, and 102b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register(s), low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 126, in one embodiment, recognize the same ISA (or a subset thereof). Alternatively, in a heterogeneous core environment, decoders 126 recognize a second ISA (either a subset of the first ISA or a distinct ISA).

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or include an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 110 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, non-volatile memory (NV memory), and other known storage devices. Note that device 180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 110 includes one or more controller(s) for interfacing with other devices such as memory 175 or a graphics device 180. The configuration including an interconnect and controllers for interfacing with such devices is often referred to as an on-core (or un-core configuration). As an example, on-chip interface 110 includes a ring interconnect for on-chip communication and a high-speed serial point-to-point link 105 for off-chip communication. Yet, in the SOC environment, even more devices, such as the network interface, co-processors, memory 175, graphics processor 180, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Voltage margining is a process performed during validation of a semiconductor device such as an integrated circuit (IC), e.g., formed of one or more semiconductor die. This margining process is performed during chip validation procedures in order to determine whether voltage levels at which signals are received and processed within the IC are sufficient such that a relatively minimal or zero error rate occurs. Complexity in voltage margining processes can extend the duration of chip validation and thus increase costs and delay time-to-market.

Oftentimes, voltage margining is performed for a device under test in a manner in which design for test (DFT) circuitry within the IC itself is used to generate a predetermined pattern used for the voltage margining processing. Although such known data enables easier post-validation review, it also means that actual data transmitted on an interconnect that couples the IC to another IC is not tested during the voltage margining processing. Instead, DFT loopback paths within the circuit itself are used, which can lead to uncertainty and complications.

Using an embodiment of the present invention, an IC under test can be coupled to another device such as another IC or other component of a system via an interconnect in a manner in which voltage margining is performed using non-deterministic data, e.g., communicated from the second IC to the device under test. In this way, voltage margining testing can be performed in a more rapid manner and furthermore, true system compatibility can be tested for purposes of voltage margining, as the actual data communicated via an interconnect coupled to the IC is received and processed.

Although the scope of the present invention is not limited in this regard, in an example system described herein, communications may be in accordance with a given communication protocol, such as an extension to a Mobile Industry Processor Alliance (MIPI) specification. In a particular embodiment, signaling between devices may occur according to a 3-phase communication protocol having a multi-voltage level scheme. Of course understand that variations in the signaling scheme are contemplated, and the voltage margining described herein in which parallel data and margining samplers are provided may be used for other schemes as well. This MIPI 3-phase protocol uses 3 different voltage levels on a channel interconnecting 2 components. Embodiments may be used to perform voltage margining on this or other multi-voltage level interfaces. Also understand that the voltage margining described herein may be used for purposes of a one-way receiver-only interface, as well as bi-directional interfaces.

Embodiments thus enable built-in debug self-testing and functional (non-deterministic) margining features for high-speed serial interfaces such as Peripheral Component Interconnect Express (PCIe), Serial Advanced Technology Attach (SATA), Universal Serial Bus (USB), MIPI or other communication protocols. Still further, voltage margining as described herein may be adapted to other multi-level signaling techniques such as pulse amplitude modulation (PAM-4).

By using arbitrary functional data patterns (instead of predetermined test patterns) for voltage margining, receiver-only interfaces can be efficiently tested without using a digital far end loopback with a component to which the receiver under test is coupled. Still further, embodiments may reduce the time spent doing voltage margining in post-silicon validation, which can reduce the time to product qualification and thus time to market. For purposes of the 3-phase communications described herein, the margining process may be used to vary eye height of the incoming pairs of signals and to enable a system to be calibrated to a worst case eye height between pairs of signals (A and B, B and C, and C and A).

Figure 2A:
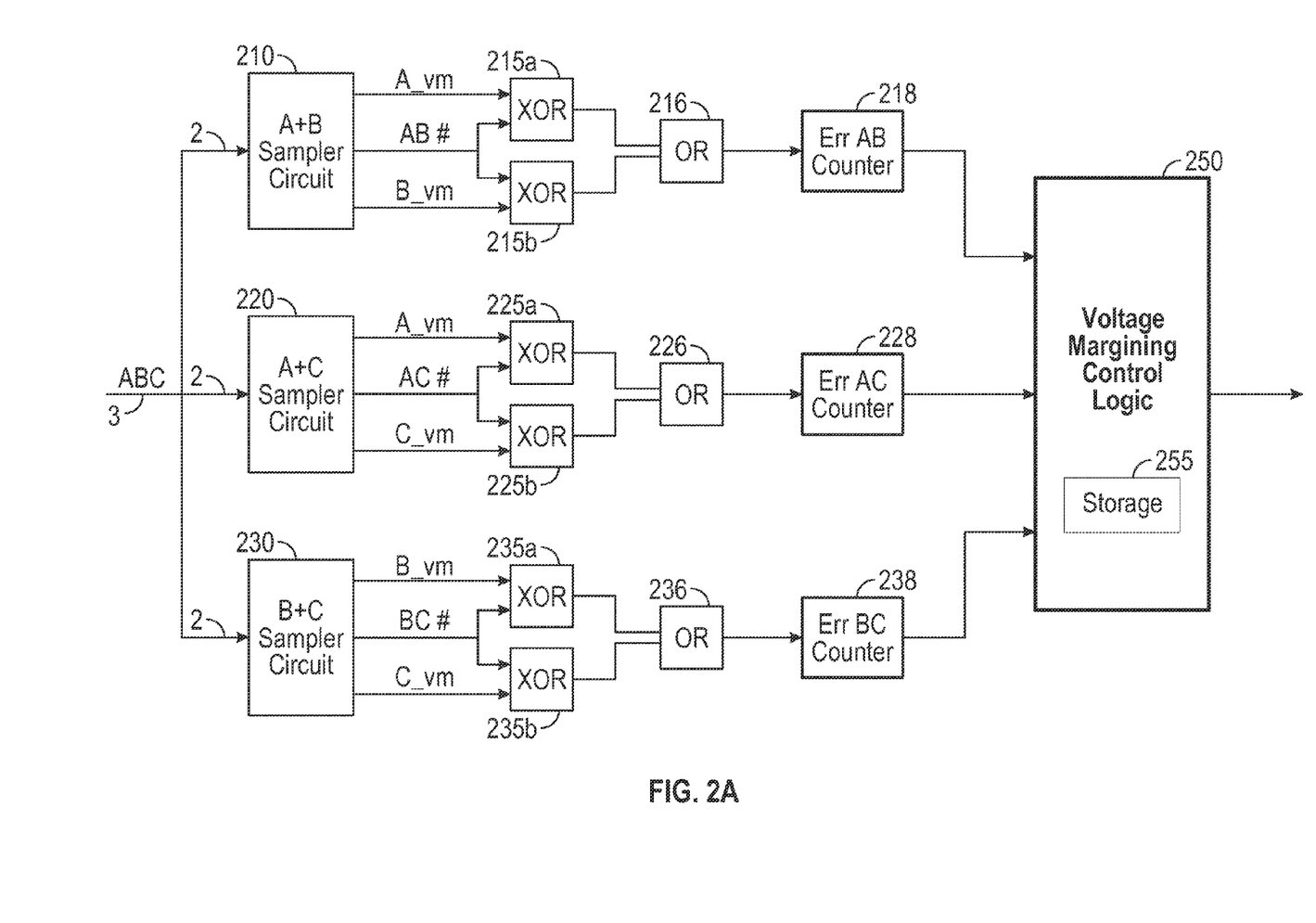
FIG. 2A is a block diagram of a voltage margining circuit in accordance with an embodiment of the present invention.

Referring now to FIG. 2A, shown is a block diagram of a voltage margining circuit in accordance with an embodiment of the present invention. As shown in FIG. 2A, margining circuit 200 may be used both for purposes of performing voltage margining, e.g., during chip validation as well as for performing at least portions of data recovery during normal operation of a functioning chip.

As shown in FIG. 2A, circuit 200 is coupled to receive incoming signals via an interconnect to which circuit 200 is coupled. In an embodiment, circuit 200 may be part of a receiver logic of an IC that couples to an interconnect that operates in accordance with a given multi-level voltage interface such as a MIPI 3-phase communication protocol. Thus as seen, 3 incoming signal lines are present, each of which communicates single-ended data, namely incoming signals A, B, and C.

As a general discussion of the communication protocol, multiple symbols may be communicated across the interconnect at high serial speeds. In the embodiment shown, two of the 3 signal lines (also referred to herein as wires) are driven to opposite polarity values, while the third wire is terminated to a mid-point level between these 2 values. Further, understand that wires to be driven and their polarities may change at each symbol. Multiple bits may be encoded into each symbol. For example, greater than 2 bits may be encoded per symbol, along with clock timing effected by ensuring that the combination of driven wires changes on symbol boundary.

Thus an interconnect coupled to circuit 200 includes 3 single-ended data lines. During operations including the voltage margining described herein, during each symbol communication, two wires are driven to opposite polarity levels and one wire is un-driven and terminated to a mid-point voltage at higher symbol rates. Note that the wires that are to be driven and the wire to be terminated changes every symbol or unit interval (UI), in an embodiment.

To enable the data communications as described herein, a transmitter (not shown in FIG. 2A for ease of illustration) may include transmitter logic that receives incoming data (e.g., 16-bit words) which are mapped into multiple symbols. These symbols may then be converted from a parallel encoding into a serial bitstream, and thereafter encoded for driving on the 3 wires of the interconnect. In turn, a receiver logic may include, after an analog front end, a symbol decoder that receives the 3 incoming signals and provides decoded signals to a serial-to-parallel converter, where parallel data output is sent to a de-mapper to thus recover the original data (e.g., 16-bit words).

Still referring to FIG. 2A, receiver circuit 200 includes a plurality of parallel sampling circuits 210, 220, and 230. As will be discussed below, each of the sampler circuits is to receive a selected pair of the 3-phase input signals (namely input signals A, B, and C) and selected reference voltage. In general, each sampler circuit 210, 220 and 230 includes a data sampler and multiple margining samplers. Each of these samplers outputs a corresponding comparison. In the implementation shown, sampler circuit 210 receives input signals A and B, sampler circuit 220 receives input signals A and C, and sampler circuit 230 receives input signals B and C. In general, the data sampler within each of the sampler circuits may be configured to receive a selected pair of the incoming signals, perform a comparison based on the voltage values of the signals, and generate a comparison value based on the comparison. These comparison values may be provided to decoding circuitry and on to functional units of the receiver (not shown in FIG. 2A), in addition to being further processed in margining circuit 200.

Each of sampler circuits 210, 220, and 230 further includes a plurality of margining samplers, each to receive a selected one of the input signals and a reference voltage level. These reference voltage levels may be programmably controlled to provide comparison values at a plurality of margining levels during a margining process. The margining samplers are configured to receive a selected incoming signal and reference voltage level and perform a comparison based on the voltage values of the signals, and generate a margining comparison value based on the comparison.

In turn, the comparison values output by these sampler circuits are provided to corresponding logic circuits 215*a* and 215*b*, 225*a* and 225*b*, and 235*a* and 235*b*, each of which may be implemented as an exclusive-OR gate. Accordingly, each of logic circuits 215, 225, and 235 performs a logic operation based on these 2 inputs. More specifically, in an implementation in which these logic circuits are exclusive-OR gates, a first value (e.g., a logic one value) is output when the comparison value from the corresponding data sampler differs from the margining value from the corresponding margining sampler (and vice versa).

Next, the outputs of each pair of logic circuits may be coupled to another logic circuit. More specifically, each pair of XOR outputs is provided to a corresponding OR gate 216, 226, and 236, where the values are OR'ed together. As such, when the values from the logic circuits differ (or both are logic high values), OR gate 216 outputs a logic high value, which indicates an error (and a first value is output). Note that each of the XOR gates and OR gates may be clocked at an appropriate sampling frequency.

Still referring to FIG. 2A, the output of each of the OR logic circuits is provided to a corresponding one of error counters 218, 228, and 238. Each of these error counters may be configured to maintain a count of first values output by the OR logic circuits such that a count is maintained of the number of errors identified by the corresponding sampler circuit. In an embodiment, each of the error counters may be configured as a 20-bit counter, although the scope of the present invention is not limited in this regard.

Each of these error counters is coupled to a voltage margining control logic 250, which may be configured to perform various configuration operations with regard to margining circuit 200, in addition to controlling switching operations for the various components within circuit 200. Control logic 250 may be implemented with appropriate combinations of hardware, software, and/or firmware. In addition, control logic 250 may include a storage 255 which may include various entries, each to store a corresponding error counter value. For example, storage 255 may be configured to store 3 error count values (from each of error counters 218, 228, and 238), for each of multiple reference voltage levels at which the margining operations are performed.

At a conclusion of a margining operation, control logic 250 may generate a report that includes, for each reference voltage combination, a set of error counts from the 3 error counters. This report may be communicated from the logic to an analysis system, where the information can be analyzed by designers to aid in determining appropriate voltage margins for configuration of the semiconductor device. Although shown at this high level in the embodiment of FIG. 2A, understand the scope of the present invention is not limited in this regard and various alternatives are possible. For example, although a 3-phase signaling scheme is shown with corresponding 3 sets of parallel samplers and supporting circuitry, understand that different numbers of such circuitry may be present in other embodiment.

Figure 2B:
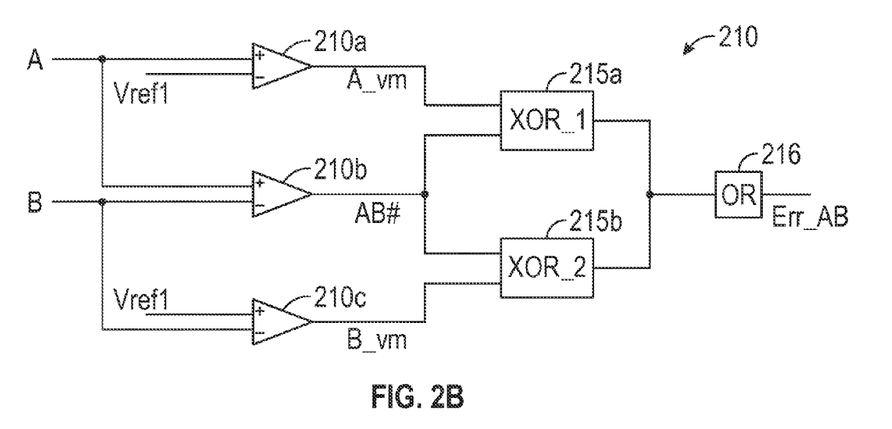
FIG. 2B is a block diagram of a particular voltage margining circuit in accordance with an embodiment of the present invention.

Referring now to FIG. 2B, shown is a block diagram of a representative sampler circuit in accordance with an embodiment of the present invention. As shown in FIG. 2B, sampler circuit 210 may correspond to sampler circuit 210 of FIG. 2A. As seen, a data sampler 210$b$ is present and configured to receive incoming input signals A and B and to generate a comparison value AB# based on the value of these signals. In turn, a pair of margining samplers 210$a$ and 210$c$ are present, each of which is configured to receive a selected one of the input signals and a corresponding reference voltage level, namely a first voltage level Vref1. As seen, margining sampler 210$a$ receives input signal A at a positive input terminal and the first reference voltage level at a negative input terminal and in turn margining sampler 210$c$ receives input signal B at a negative input terminal and receives the first reference voltage level at a positive input terminal. Each of these margining samplers is configured to compare a corresponding input signal with the reference voltage level and output a corresponding margining comparison value (namely A_vm and B_vm).

The comparison results from all of samplers 210$a$-210$c$ are coupled to a pair of logic circuits 215$a$ and 215$b$, namely a pair of XOR gates each to receive the comparison value and one of the margining comparison values and to generate an output, provided in turn to another logic circuit 216, namely an OR gate to generate a logic high value or in other words an active error value (Err_AB), when the values from the XOR outputs differ (or they both output a logic high value).

Note that in the embodiment of FIG. 2B, under control of appropriate control logic such as voltage margining control logic 250, Vref1 may be swept either from a minimum value to a maximum value or vice versa. A first predetermined reference level value Vref1_B is the point at which the value of the first reference voltage level (Vref1) equals input signal B, which causes XOR 215$b$ output to flip logic state. A second predetermined reference level value Vref1_A is the point at which the value of the first reference voltage level (Vref1) equals input signal A, which causes XOR 215$a$ output to flip logic state.

Figure 2C:
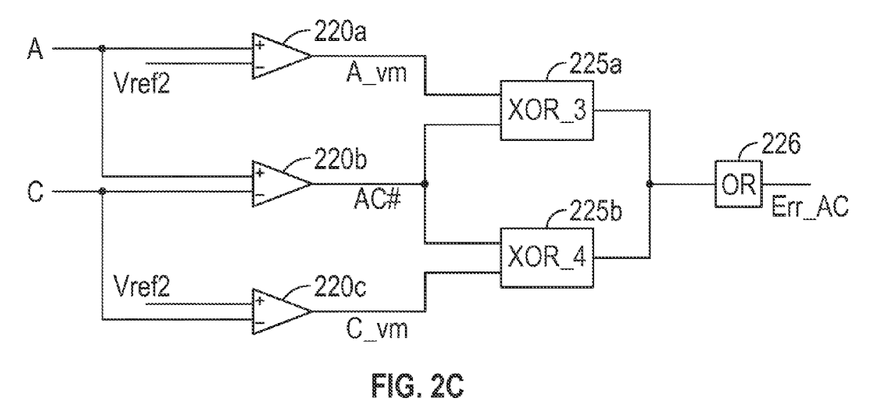
FIG. 2C is a block diagram of a particular voltage margining circuit in accordance with an embodiment of the present invention.
Figure 2D:
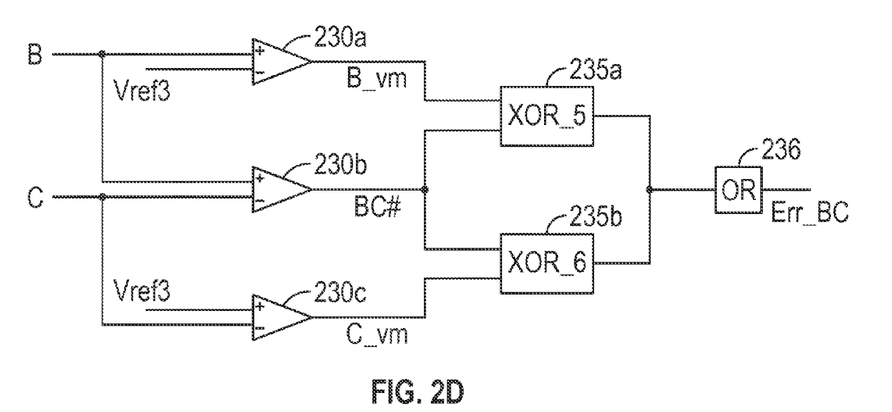
FIG. 2D is a block diagram of a particular voltage margining circuit in accordance with an embodiment of the present invention.

Accordingly, a voltage margin may equal the absolute value of the difference between these two predetermined reference voltage values. Specifically, voltage margin=abs (Vref1_B−Vref1_A). As such, the error output signal from OR gate 216 equals zero when the outputs of XOR gates 215$a$ and 215$b$ both equal zero. This condition may occur when: (1) A>B=>A>Vref1>B; or (2) A<B=>A<Vref1<B. Of course understand while set forth for this particular implementation in the embodiment of FIG. 2B, other configurations are possible and may be used to similarly generate an error count based on reference voltage levels. As seen in FIGS. 2C and 2D, similar sampler circuits 220 and 230 are provided for checking for the presence of errors with regard to input signals A and C, and B and C, respectively.

With reference to FIG. 2C, Vref2 may be swept either from minimum to maximum or vice versa. Here, Vref2_A is the point where Vref2=A, causing XOR 225$a$ output to flip logic state. And, Vref2_C is the point where Vref2=C, causing XOR 225$b$ output to flip logic state. In turn, the voltage margin=abs(Vref2_A−Vref2_C). And, Error=0 when XOR 225$a$=XOR 225$b$=0: (1) if A>C=>A>Vref2>C; or (2) if A<C=>A<Vref2<C.

With reference to FIG. 2D, Vref3 may be swept either from minimum to maximum or vice versa. Here, Vref3_B is the point where Vref3=B, causing XOR 235$a$ output to flip logic state. And, Vref3_C is the point where Vref3=C, causing XOR 235$b$ output to flip logic state. In turn, the voltage margin=abs(Vref3_B−Vref3_C). And, Error=0 when XOR 235a=XOR 235b=0: (1) if B>C=>B>Vref3>C; or (2) if B<C=>B<Vref3<C.

Figure 3:
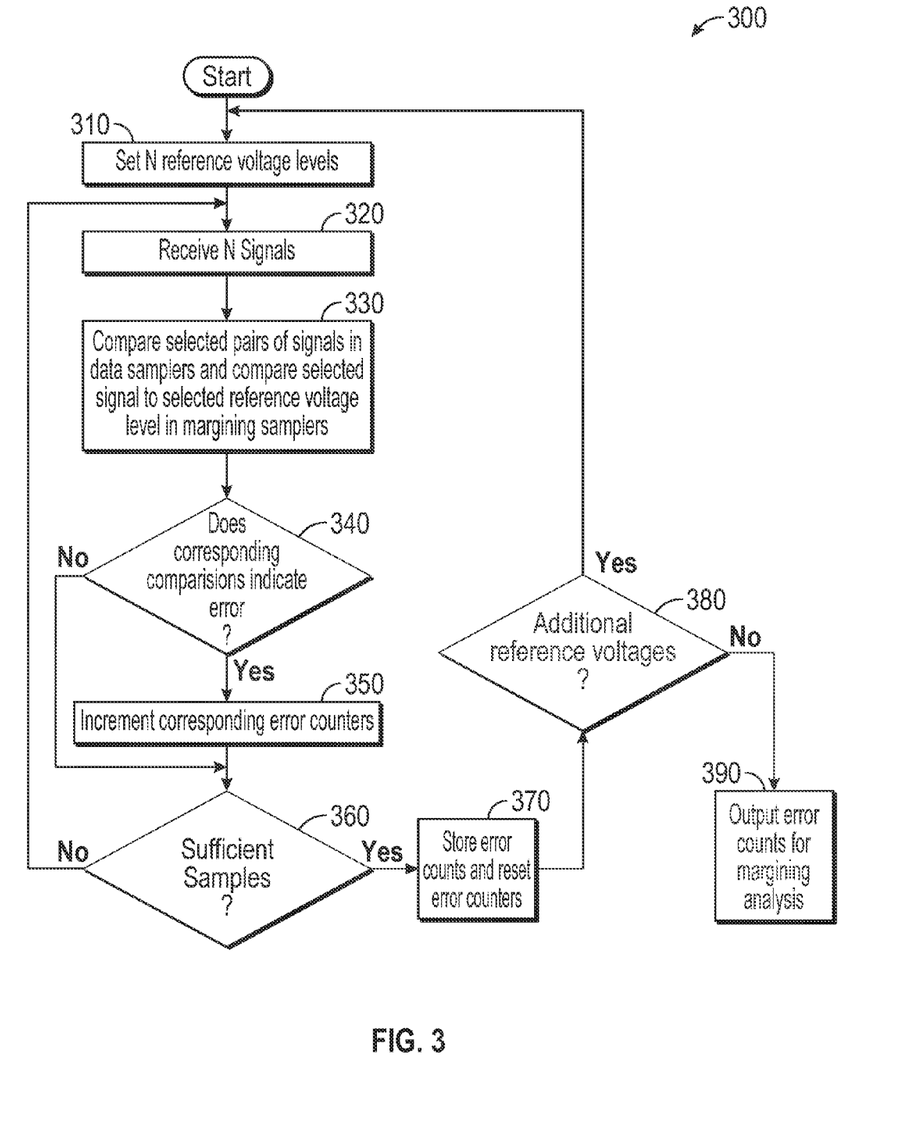
FIG. 3 is a flow diagram of a margining process in accordance with an embodiment of the present invention.

Referring now to FIG. 3, shown is a flow diagram of a margining process in accordance with an embodiment of the present invention. As shown in FIG. 3, method 300 may be performed using a margining circuit such as shown in FIG. 2A. Further, understand that at least some of the control operations implemented within method 300 may be performed using the control logic of the margining circuit itself. As seen, method 300 begins by setting N reference voltage levels (block 310). Assume for purposes of discussion a 3-phase communication protocol as described herein. As such, N equals 3. Note that these reference voltage levels may be set by the voltage margining control logic and may be controllably swept across a range of reference voltages. For example, in an embodiment the control logic may control these reference voltages in a sweep pattern from a low reference voltage level to a high reference voltage level, e.g., from 0 volts (V) to 0.3 V. For purposes of a first iteration of method 300, assume that the first set of reference voltage levels for voltage signals Vref1-Vref3 is at zero V.

Control next passes to block 320 where N signals may be received. More specifically in this example, three incoming signals are received from an interconnect coupled to the semiconductor device and received via an analog front end. These three signals may be of a 3-phase communication protocol such that one of the signals is of a first polarity (e.g., a logic high value), a second signal is at an opposite polarity (e.g., a logic low value), and the third signal may be at a midpoint between these two signals.

The received signals may then be processed in parallel data and margining samplers. More specifically, as shown in FIG. 3 at block 330 selected pairs of the signals may be compared in corresponding data samplers, while a given one of the signals and a selected reference voltage level may be compared in corresponding margining samplers. For example, as shown in FIG. 2B, signals A and B may be compared in data sampler 210b while input signal A may be compared to a first reference voltage (Vref1) in a margining sampler 210a and the input signal B may be compared to the first reference voltage in a margining sampler 210c.

Still referring to FIG. 3, control next passes to diamond 340 where it can be determined whether a corresponding comparison indicates an error. Such indication of an error may exist when the values output by the corresponding data and parallel margining samplers are different as determined to be cascaded logic circuitry including plural XOR gates and a single OR gate. If so, the corresponding error counter may be incremented (block 350).

Next control passes to diamond 360 to determine whether a sufficient number of samples have been processed for the current set of reference voltage levels. Although the scope of the present invention is not limited in this regard, in an embodiment a sufficient sample size may be between approximately $3 \times 10^6$ to $3 \times 10^9$ samples. If a sufficient number has not been processed, control passes back to block 320 for further iterations to thus process additional samples.

Otherwise if sufficient samples are present, control passes to block 370. There the error counts may be stored, and the corresponding error counters reset. More specifically, the values of the error counts in each of the error counters may be provided to an appropriate storage, such as present in a voltage margining control logic. Thereafter the error counters may be reset.

Next control passes to diamond 380, where it can be determined whether additional reference voltages are to be analyzed. That is, as discussed above the reference voltage levels may be swept across a range from low to high values. If not all reference voltage levels have been analyzed, control passes back to block 310 above, where another set of reference voltage levels may be used for further margining operations.

At the conclusion of the margining operations, a report may be generated and the error counts may be output, e.g., to a test system to which the semiconductor device is coupled for further analysis. For example, based on the error counts associated with each of the different reference voltage levels, an appropriate margin level for configuration of the semiconductor device may occur. Although shown at this high level in the embodiment of FIG. 3, understand the scope of the present invention is not limited in this regard.

Figure 4:
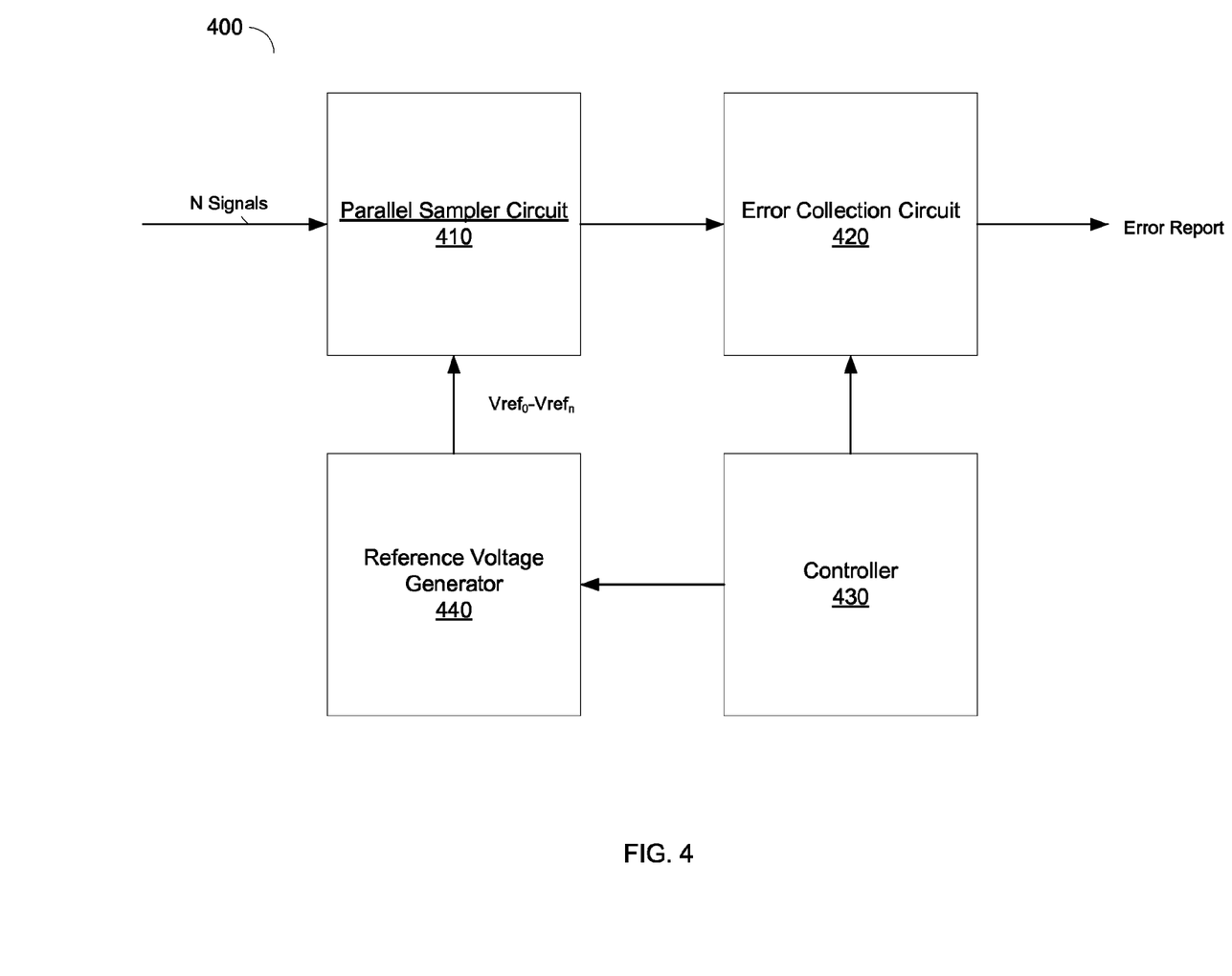
FIG. 4 is a block diagram of a voltage margining circuit in accordance with another embodiment.

Referring now to FIG. 4, shown is a block diagram of a voltage margining circuit in accordance with another embodiment. As shown in FIG. 4, circuit 400 is represented at a high level including various circuitry to receive incoming signals, e.g., from an interconnect and perform voltage margining using the signals. Note that the incoming signals can be of non-deterministic data patterns communicated by a transmitter or other circuit that chip validation personnel cannot directly control.

Margining circuit 400 is coupled to receive the incoming signals of a multi-level communication protocol in a parallel sampler circuit 410. Circuit 410 may include parallel sets of data and margining samplers as described herein to respectively sample selected pairs of the incoming signals and compare the selected incoming signals with a corresponding reference voltage level. In turn, these reference voltage levels may be received from a reference voltage generator 440, which in an embodiment may be an on-chip voltage regulator. In other implementations, one or more incoming voltages received from an off-chip regulator may be conditioned in reference voltage generator 440 to provide these reference voltage levels to parallel sampler circuit 410.

The resulting comparisons performed in parallel sampler circuit 410 may further be processed and thereafter provided to an error collection circuit 420, which may include one or more counters to maintain a count of bit errors received while parallel sampler circuit 410 operates with particular reference voltage levels. As an example, an error counter may be associated with each pair of data and margining samplers to store an error count for a particular set of reference voltage levels. In addition, error collection circuit 420 further may include a storage to store the count values, e.g., at conclusion of margining testing at a given reference voltage level.

Note that this change in reference voltage levels, as well as the direction to store the values may be under control of a controller 430, which may be implemented in hardware, software and/or firmware to thus control the reference levels generated in reference voltage generator 440 as well as to control error collection circuit 420. Furthermore, controller 430 may control the voltage margining process such that at a conclusion thereof, an error report may be generated and communicated to an appropriate entity, such as an analysis system. Note that in certain embodiments, controller 430 may perform method 300 of FIG. 3. Although shown at this high level in the embodiment of FIG. 4, understand the scope of the present invention is not limited in this regard.

Figure 5:
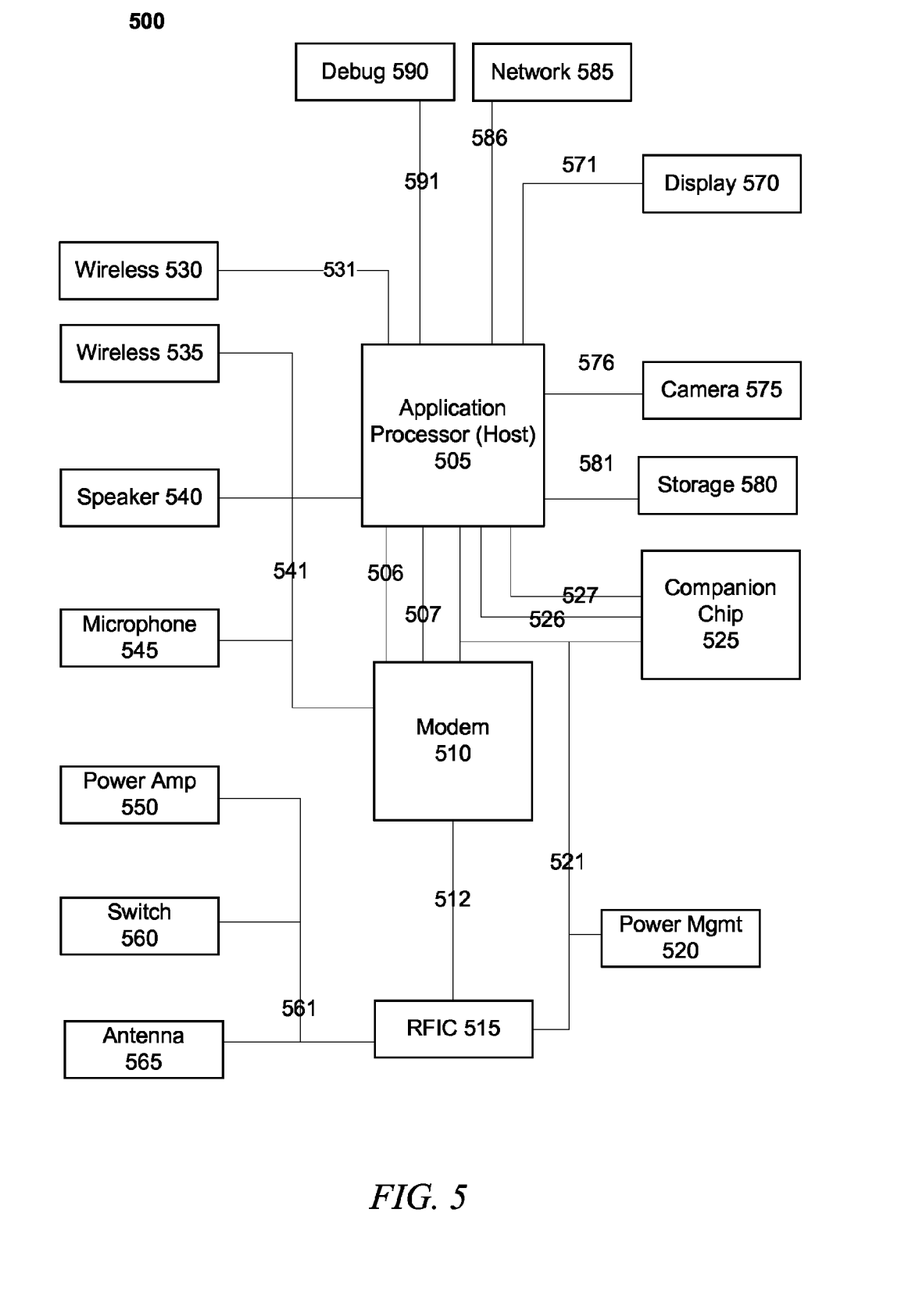
FIG. 5 is a block diagram of a system in accordance with an embodiment of the present invention.

Referring to FIG. 5, an embodiment of a low power computing platform is depicted. In one embodiment, low power computing platform 500 incudes a user endpoint, such as a phone, smartphone, tablet, ultraportable notebook, a notebook, a desktop, a server, a transmitting device, a receiving device, or any other known or available computing platform. The illustrated platform depicts a number of different interconnects to couple multiple different devices. Exemplary discussion of these interconnect are provided below to provide options on implementation and inclusion. However, a low power platform 500 is not required to include or implement the depicted interconnects or devices. Furthermore, other devices and interconnect structures that are not specifically shown may be included.

Starting at the center of the diagram, platform 500 includes an application or host processor 505. Often this includes a low power processor, which may be a version of a processor configuration described herein or known in the industry. As one example, processor 500 is implemented as a system on a chip (SoC). As a specific illustrative example, processor 500 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor.

As further shown in FIG. 5, host processor 505 couples to various devices. Different types of communication protocols, including MIPI, PCIe, USB, DVI, among many others, may be used to provide interconnection. In the specific implementation shown in FIG. 5, processor 505 couples to a first wireless device 530 via an interconnect 531. In an embodiment, wireless device 530 is a local area wireless device such as a wireless device in accordance with a given one or more IEEE 802.11 standard. To provide output audio, host processor 505 couples to one or more speakers 540.

Host processor 505 couples to a network device 585 via an interconnect 586 and further couples to a debug device 590 via an interconnect 591. To provide output of display information, e.g., high definition video content, host processor 505 may be in communication with a display 570 such as a flat panel display, a touchscreen or other display, via an interconnect 571.

For purposes of receiving incoming capture information such as via a still and/or video camera, an interconnect 576 couples host processor 505 to a camera device 575. A storage 580, which may be one or more storage devices including volatile and non-volatile memory and other storage devices, couple to host processor 505 via an interconnect 581. For certain peripheral operations, a companion chip 525 may be in communication with host processor 505 via interconnects 526 and 527. In turn, interconnects 506 and 507 couple between host processor 505 and a modem 510 that in turn may couple to a radio frequency integrated circuit (RFIC) 515 via an interconnect 512. Modem 510 further may be in communication with microphone 545 and a second wireless device 535 via an interconnect 541. In an embodiment, second wireless device 535 may be a wide area wireless device such as a wireless device that operates according to a given cellular communication protocol.

Still referring to FIG. 5, various devices couple to RFIC 515 via an interconnect 561. In the embodiment of FIG. 5, these devices include an antenna 565, a switch 560, and a power amplifier 550.

A power management controller 520 couples via an interconnect 521 to various components of the system to provide power management on a platform-wide level. Such power management activities performed by power management controller 520 may be in addition to and/or complementary to power management operations internally controlled by individual devices, such as an internal power management unit of a host processor 505. Although shown at this high level in the implementation of FIG. 5, understand the scope of the present invention is not limited in this regard and many alternatives and variations are possible. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

The following examples pertain to further embodiments.

In one example, an apparatus comprises: a parallel sampler circuit to receive a plurality of signals from an interconnect and to receive a plurality of reference voltage levels from a reference level generator, at least two of the signals received at opposite polarity levels and a third of the signals received at a midpoint value between the opposite polarity levels, the parallel sampler circuit to indicate when a bit error occurs for a sample of the plurality of signals; and an error collection circuit coupled to the parallel sampler circuit and including one or more error counters to maintain a count of samples having a bit error and to communicate a report of the count of samples maintained for a voltage margining process performed on non-deterministic data.

In an example, the plurality of signals are received at multiple voltage levels of a multi-phase communication protocol, and at a symbol demarcation, the signal having the midpoint value changes. In an example, the parallel sampler circuit comprises: a plurality of data samplers each to receive a selected pair of a first signal, a second signal, and a third signal, and to output a corresponding value based on a comparison of the selected pair; and a plurality of margin samplers each to receive a selected one of the first, second and third signals and a selected one of a first reference voltage level, a second reference voltage level, and a third reference voltage level, and to output a corresponding margining value based on a comparison of the selected first, second or third signal, and the selected first, second, or third reference voltage level. The parallel sampler circuit may further include: a first plurality of logic circuits each coupled to one of the plurality of data samplers and one of the plurality of margin samplers and to output a first value when the corresponding value from the corresponding data sampler differs from the corresponding margining value from the corresponding margin sampler; and a second plurality of logic circuits each coupled to a pair of the first plurality of logic circuits and to output an error value based on outputs of the pair. The error value may indicate a bit error for a sample of the first signal, the second signal, and the third signal.

In an example, the error collection circuit comprises a plurality of counters each coupled to one of the second plurality of logic circuits to maintain a count of the error value output by the corresponding second plurality of logic circuits. A controller may be configured to dynamically control the reference voltage generator to update a value of the first, second and third reference voltage levels. The controller may dynamically control the reference voltage generator to update the value of the first, second and third reference voltage levels between a floor value and a ceiling value, based at least in part on a number of the samples received.

In an example, the apparatus is a processor that can be implemented using various means.

In an example, the processor comprises a system on a chip (SoC) incorporated in a user equipment touch-enabled device.

In another example, a system comprises a display and a memory, and includes the processor of one or more of the above examples.

In another example, an apparatus comprises: a plurality of data samplers each to receive a selected pair of a first signal, a second signal, and a third signal, and to output a corresponding value based on a comparison of the selected pair; a plurality of margin samplers each to receive a selected one of the first, second and third signals and a selected one of a first reference voltage, a second reference voltage, and a third reference voltage, and to output a corresponding margining value based on a comparison of the selected first, second or third signal and the selected first, second, or third reference voltage; and a plurality of logic circuits each coupled to one of the plurality of data samplers and one of the plurality of margin samplers and to output an error value for a selected pair based on the corresponding value from the corresponding data sampler and the corresponding margining value from the corresponding margin sampler.

In an example, a plurality of counters each are coupled to one of the plurality of logic circuits to maintain a count of the error value output by the corresponding logic circuit. A controller may be coupled to the plurality of counters and to dynamically adjust a margin for detection of incoming signals as a first state or a second state based at least in part on the counts from the plurality of counters. The controller may dynamically control a value of the first, second and third reference voltages. In an example, the controller is to dynamically adjust the margin during communication of non-deterministic data received from a transmitter coupled to the apparatus.

In an example, a recovery logic is to receive the corresponding values from the plurality of data samplers and to determine a bit value therefrom, and to provide the bit value to a functional unit. The first, second and third signals may be received in the plurality of data samplers according to a three-phase data protocol.

In another example, a method comprises: receiving a plurality of signals in a receiver logic of an IC; comparing a selected pair of the plurality of signals in each of a plurality of data samplers, and comparing a selected signal of the plurality of signals to a selected reference voltage level in each of a plurality of margining samplers; and updating a first count value in a first error counter based on a comparison of a first output of a first data sampler of the plurality of data samplers with each of a first margining output of a first margining sampler of the plurality of margining samplers and a second margining output of a second margining sampler of the plurality of margining samplers.

In an example, the method further comprises receiving the plurality of signals, comparing the selected pairs and the selected signals for a plurality of samples of the plurality of signals. The method may further comprise, after receiving the plurality of samples, updating the selected reference voltage levels to be provided to each of the plurality of margining samplers.

In an example, the method further comprises providing the first count value to a margining analysis routine, the margining analysis routine to perform voltage margining of the IC based at least in part on the count value. The plurality of signals may comprise non-deterministic data received in the IC from a second IC, wherein the IC comprises a device under test and the second IC comprises a transmitter that is controlled non-deterministically.

In an example, the method further comprises: receiving the plurality of signals of a first sample in which a first signal is of a first polarity, a second signal is of a second polarity opposite to the first polarity, and a third signal is at a midpoint level between the first and second signals, wherein the sample is of a first symbol, and a second symbol following the first symbol includes a second sample in which the second signal is of the first polarity, the third signal is of the second polarity, and the first signal is at a midpoint level between the second and third signals.

In another example, a computer readable medium including instructions is to perform the method of any of the above examples.

In another example, an apparatus comprises means for performing the method of any one of the above examples.

In another example, a system comprises a transmitter to transmit data and a receiver coupled to the transmitter via an interconnect, the receiver including a voltage margining circuit to receive non-deterministic data transmitted by the transmitter via a multi-level signaling scheme and to generate a bit error report including bit error information obtained at a plurality of margining levels.

In an example, the voltage margining circuit comprises: a parallel sampler circuit to receive the non-deterministic data as a plurality of signals and to receive a plurality of reference voltage levels, at least two of the plurality of signals received at opposite polarity levels and a third of the plurality of signals received at a midpoint value between the opposite polarity levels, the parallel sampler circuit to indicate when a bit error occurs for a sample of the plurality of signals; and an error collection circuit coupled to the parallel sampler circuit and including one or more error counters to maintain a count of samples having a bit error. The error value may be indicative of a bit error for a sample of the non-deterministic data. A controller may dynamically control a value of the first, second and third reference voltage levels, at each of the plurality of margining levels. The controller may also dynamically control the value of the first, second and third reference voltage levels between a floor value and a ceiling value, based at least in part on a number of the plurality of samples received.

Understand that various combinations of the above examples are possible.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a parallel sampler circuit to receive a plurality of signals from an interconnect and to receive a plurality of reference voltage levels from a reference level generator, at least two of the plurality of signals received at opposite polarity levels and a third of the plurality of signals received at a midpoint value between the opposite polarity levels, the parallel sampler circuit to indicate when a bit error occurs for a sample of the plurality of signals, wherein the parallel sampler circuit comprises:
   a plurality of data samplers each to receive a selected pair of a first signal, a second signal, and a third signal of the plurality of signals received from the interconnect, and to output a corresponding value based on a comparison of the selected pair; and
   an error collection circuit coupled to the parallel sampler circuit and including one or more error counters to maintain a count of samples having a bit error and to communicate a report of the count of samples maintained for a voltage margining process performed on non-deterministic data.

2. The apparatus of claim 1, wherein the plurality of signals are received at multiple voltage levels of a multi-phase communication protocol, and wherein at a symbol demarcation, the one of the plurality of signals having the midpoint value changes.

3. The apparatus of claim 1, further comprising:
   a plurality of margin samplers each to receive a selected one of the first, second and third signals and a selected one of a first reference voltage level, a second reference voltage level, and a third reference voltage level, and to output a corresponding margining value based on a comparison of the selected first, second or third signal, and the selected first, second, or third reference voltage level.

4. The apparatus of claim 3, wherein the parallel sampler circuit further includes:

a first plurality of logic circuits each coupled to one of the plurality of data samplers and one of the plurality of margin samplers and to output a first value when the corresponding value from the corresponding data sampler differs from the corresponding margining value from the corresponding margin sampler; and a second plurality of logic circuits each coupled to a pair of the first plurality of logic circuits and to output an error value based on outputs of the pair.

5. The apparatus of claim 4, wherein the error value indicates a bit error for a sample of the first signal, the second signal, and the third signal.

6. The apparatus of claim 4, wherein the error collection circuit comprises a plurality of counters each coupled to one of the second plurality of logic circuits to maintain a count of the error value output by the corresponding second plurality of logic circuits.

7. The apparatus of claim 3, further comprising a controller to dynamically control the reference voltage generator to update a value of the first, second and third reference voltage levels.

8. The apparatus of claim 7, wherein the controller is to dynamically control the reference voltage generator to update the value of the first, second and third reference voltage levels between a floor value and a ceiling value, based at least in part on a number of the samples received.

9. An apparatus comprising:
a plurality of data samplers each to receive a selected pair of a first signal, a second signal, and a third signal received via an interconnect, and to output a corresponding value based on a comparison of the selected pair;
a plurality of margin samplers each to receive a selected one of the first, second and third signals and a selected one of a first reference voltage, a second reference voltage, and a third reference voltage, and to output a corresponding margining value based on a comparison of the selected first, second or third signal and the selected first, second, or third reference voltage; and
a plurality of logic circuits each coupled to one of the plurality of data samplers and one of the plurality of margin samplers and to output an error value for a selected pair based on the corresponding value from the corresponding data sampler and the corresponding margining value from the corresponding margin sampler.

10. The apparatus of claim 9, further comprising a plurality of counters each coupled to one of the plurality of logic circuits to maintain a count of the error value output by the corresponding logic circuit.

11. The apparatus of claim 10, further comprising a controller coupled to the plurality of counters and to dynamically adjust a margin for detection of incoming signals as a first state or a second state based at least in part on the counts from the plurality of counters.

12. The apparatus of claim 11, wherein the controller is to dynamically control a value of the first, second and third reference voltages.

13. The apparatus of claim 12, wherein the controller is to dynamically adjust the margin during communication of non-deterministic data received from a transmitter coupled to the apparatus.

14. The apparatus of claim 9, further comprising a recovery logic to receive the corresponding values from the plurality of data samplers and to determine a bit value therefrom, and to provide the bit value to a functional unit.

15. The apparatus of claim 9, wherein the first, second and third signals are received in the plurality of data samplers according to a three-phase data protocol.

16. A method comprising:
receiving a plurality of signals in a receiver logic of an integrated circuit (IC) via an interconnect;
comparing a selected pair of the plurality of signals in each of a plurality of data samplers, and comparing a selected signal of the plurality of signals to a selected reference voltage level in each of a plurality of margining samplers; and
updating a first count value in a first error counter based on a comparison of a first output of a first data sampler of the plurality of data samplers with each of a first margining output of a first margining sampler of the plurality of margining samplers and a second margining output of a second margining sampler of the plurality of margining samplers.

17. The method of claim 16, further comprising receiving the plurality of signals, comparing the selected pairs and the selected signals for a plurality of samples of the plurality of signals.

18. The method of claim 17, further comprising, after receiving the plurality of samples, updating the selected reference voltage levels to be provided to each of the plurality of margining samplers.

19. The method of claim 16, further comprising providing the first count value to a margining analysis routine, the margining analysis routine to perform voltage margining of the IC based at least in part on the count value.

20. The method of claim 16, wherein the plurality of signals comprise non-deterministic data received in the IC from a second IC, wherein the IC comprises a device under test and the second IC comprises a transmitter that is controlled non-deterministically.

21. The method of claim 16, further comprising:
receiving the plurality of signals of a first sample in which a first signal is of a first polarity, a second signal is of a second polarity opposite to the first polarity, and a third signal is at a midpoint level between the first and second signals, wherein the sample is of a first symbol, and a second symbol following the first symbol includes a second sample in which the second signal is of the first polarity, the third signal is of the second polarity, and the first signal is at a midpoint level between the second and third signals.

22. A system comprising:
a transmitter to transmit data; and
a receiver coupled to the transmitter via an interconnect, the receiver including a voltage margining circuit to receive non-deterministic data transmitted by the transmitter via a multi-level signaling scheme and to generate a bit error report including bit error information obtained at a plurality of margining levels, wherein the voltage margining circuit comprises:
a parallel sampler circuit to receive the non-deterministic data as a plurality of signals including a first signal, a second signal and a third signal, the parallel sampler circuit comprising:
a plurality of data samplers each to receive a selected pair of the first signal, the second signal, and the third signal, and to output a corresponding value based on a comparison of the selected pair.

23. The system of claim 22, wherein the
parallel sampler circuit is further to receive a plurality of reference voltage levels, at least two of the plurality of signals received at opposite polarity levels and a third of the plurality of signals received at a midpoint value between the opposite polarity levels, the parallel sampler circuit to indicate when a bit error occurs for a sample of the plurality of signals; and an error collection circuit coupled to the parallel sampler circuit and including one or more error counters to maintain a count of samples having a bit error.

24. The system of claim 23, wherein the plurality of signals are received at multiple voltage levels of the multi-level signaling scheme, and wherein at a symbol demarcation, the one of the plurality of signals having the midpoint value changes.

25. The system of claim 23, wherein the parallel sampler circuit further comprises:

a plurality of margin samplers each to receive a selected one of the first, second and third signals and a selected one of a first reference voltage level, a second reference voltage level, and a third reference voltage level, and to output a corresponding margining value based on a comparison of the selected first, second or third signal, and the selected first, second, or third reference voltage level.

26. The system of claim 25, wherein the parallel sampler circuit further includes:

a first plurality of logic circuits each coupled to one of the plurality of data samplers and one of the plurality of margin samplers and to output a first value when the corresponding value from the corresponding data sampler differs from the corresponding margining value from the corresponding margin sampler; and a second plurality of logic circuits each coupled to a pair of the first plurality of logic circuits and to output an error value based on outputs of the pair.

27. The system of claim 26, wherein the error value indicates a bit error for a sample of the non-deterministic data.

28. The system of claim 25, further comprising a controller to dynamically control a value of the first, second and third reference voltage levels, at each of the plurality of margining levels.

29. The system of claim 28, wherein the controller is to dynamically control the value of the first, second and third reference voltage levels between a floor value and a ceiling value, based at least in part on a number of the plurality of samples received.

* * * * *